United States Patent [19]
Asano

[11] Patent Number: 5,892,284
[45] Date of Patent: Apr. 6, 1999

[54] SEMICONDUCTOR INTEGRATED CIRCUIT

[75] Inventor: Shintaro Asano, Kanagawa, Japan

[73] Assignee: NEC Corporation, Tokyo, Japan

[21] Appl. No.: 63,712

[22] Filed: Apr. 21, 1998

[30] Foreign Application Priority Data

Apr. 21, 1997 [JP] Japan .................................. 9-103096

[51] Int. Cl.$^6$ .......................... H01L 23/48; H01L 23/52; H01L 29/40
[52] U.S. Cl. .......................... 257/758; 257/759; 257/642; 257/750
[58] Field of Search .................................. 257/752, 758, 257/642, 647, 650, 644, 759, 750

[56] References Cited

U.S. PATENT DOCUMENTS

| | | |
|---|---|---|
| 5,559,362 | 9/1996 | Narita . |
| 5,593,925 | 1/1997 | Yamaha . |
| 5,602,423 | 2/1997 | Jain . |
| 5,757,077 | 5/1998 | Chung et al. . |
| 5,763,954 | 6/1998 | Hyajutake . |
| 5,847,464 | 12/1998 | Singh et al. . |

*Primary Examiner*—Carl Whitehead, Jr.
*Assistant Examiner*—S. V. Clark
*Attorney, Agent, or Firm*—Foley, Hoag & Eliot, LLP

[57] ABSTRACT

A semiconductor integrated circuit includes upper level and lower level substrate interconnection layers which are positioned in a scribing line area and which are separated from each other an interlayer insulating film formed therebetween. For planarization, an upper surface of the interlayer insulating film is coated with an SOG silicon oxide insulating film formed by coating an SOG organic solution by means of a spin coating. The lower level substrate interconnection layer is divided into a plurality of segments separated from each other by gaps which are provided at a plurality of different locations and which allow the SOG organic solution to escape through the gaps by a centrifugal force when the SOG organic solution is applied by the spin coating. The upper level substrate interconnection layer is electrically connected to the plurality of segments of the lower level substrate interconnection layers through contacts hole formed to penetrate through the interlayer insulating film.

4 Claims, 11 Drawing Sheets

SEMICONDUCTOR INTEGRATED CIRCUIT

BACKGROUND OF THE INVENTION

1. Field of the Invention

The present invention relates to a semiconductor integrated circuit, and more specifically to a semiconductor integrated circuit having a multi-level interconnection structure and an interlayer film formed by coating an organic solution of a silicon compound.

2. Description of Related Art

In the semiconductor integrated circuit, in the prior art, an increase of integration density in a semiconductor manufacturing process is indispensable to increase the number of circuit elements and to reduce the size of an integrated circuit chip. In order to satisfy this demand, various approaches have been proposed. As one of the proposed approaches, a multi-level interconnection structure has been known as a means which can relatively simply achieve the high density. In this multi-level interconnection structure, the larger the number of interconnection levels is, a concavo-convex occurs in interlayer insulating films, with the result that a microminiaturization of interconnection comes to have a limitation, and there occur various obstacles including disconnection of the interconnection at a step and a shortened lift of interconnection. As a result, reliability of the semiconductor integrated circuit drops. Therefore, it is important to simultaneously realize both microminiaturization of interconnection and planarization of the interlayer insulating films.

The planarization technique includes a method for coating a SOG (spin-on-glass) solution between first level and second level aluminum layers in the case of a double-layer aluminum process. A coating of the SOG solution can be carried out by various methods depending upon the semiconductor device manufacturing process. For example, in one typical method, after formation of an interlayer insulating film, a wafer is rotated about a center of the wafer, and the SOG solution is dropped from an upper position, so that the SOG is distributed throughout the wafer by action of a centrifugal force of the rotation. Thereafter, the wafer is heat-treated to evaporate an organic solvent of the SOG solution and to advance the dehydration and polymerization of the silicon compound, so that a silicon oxide film is formed. Furthermore, the SOG silicon oxide film thus formed to cover the whole surface of the wafer is etched back to remove an unnecessary silicon oxide film, so that only recesses in the interlayer insulating film between the first level and second level aluminum layers are filled with the SOG silicon oxide film. Thus, the planarization is completed.

In ordinary cases, in a scribing line area or in the neighborhood of the scribing line area on the wafer, a substrate interconnection is formed at the level of a first level or lower level interconnection layer, and is connected to the semiconductor substrate through a predetermined contact so that a substrate potential is supplied to the substrate. The substrate interconnection is formed to depict a closed loop completely surrounding a chip inner region of each semiconductor integrated circuit chip. In the periphery of each chip, therefore, a dam is built because of the thickness of the substrate interconnection layer. Because of this construction, when the SOG solution is coated by the centrifugal force of the rotation, the SOG solution deposited on portions other than the recesses is not completely escaped since it is blocked by the dam, with the result that the silicon oxide film formed by coating the SOG solution is upheaved in the proximity of the substrate interconnection.

Now, a specific example will be described with reference to FIGS. 9 and 10. FIG. 9 is a diagrammatic enlarged plan view illustrating the location of a lower level substrate interconnection in a semiconductor chip 5, in the prior art, and picked up from many semiconductor chips formed in a semiconductor wafer 19 as shown in FIG. 1. FIG. 10 is a diagrammatic partial sectional view of a substrate interconnection portion of the prior art semiconductor chip, where the SOG silicon oxide layer is deposited thickly.

In this semiconductor chip 5, as shown in FIG. 9, a lower level substrate interconnection 6 formed at the level of a first level interconnection layer, is formed to depict a closed loop completely surrounding the chip inner region of the semiconductor chip 5, at an inside of a scribing line area 8 provided along a peripheral edge of the semiconductor chip 5. As shown in FIG. 10, the lower level substrate interconnection 6 is formed to extend from the surface of the semiconductor substrate 9 to the top of a step which is formed of a field oxide film 11 and an interlayer insulating film 12 formed thereon. In the scribing line area 8 or in the neighborhood of the region 8 in this semiconductor chip 5, as shown in FIG. 10, the lower level substrate interconnection 6 formed at the first level of the interconnection layer, is connected to a diffused layer 17 formed at the surface of the semiconductor substrate 9 at a contact 10 between the lower level substrate interconnection 6 and the semiconductor substrate 9, for the purpose of supplying a predetermined substrate potential to the semiconductor substrate 9.

Another interlayer insulating film 13 is formed to cover the lower level substrate interconnection 6 and the interlayer insulating film 12. As a result, steps are generated not only in the proximity of the scribing line area, but also on the surface of the interlayer insulating film 13 because of the thickness of the interconnection layer, depending upon whether or not the first level interconnection layer exists on the interlayer insulating film 12. In order to fill the recesses created by the steps, the SOG solution is coated and dried for planarization.

In the prior art semiconductor integrated circuit mentioned above, after the SOG solution is coated, the heat treatment is carried out to form the silicon oxide film 14, and then, an unnecessary portion of the silicon oxide film is etched back. In this etching-back process, if the silicon oxide film is etched back to the degree that the recesses created by the steps are just filled with the SOG silicon oxide film, the SOG silicon oxide film 14 remains on the upheaved portion of the interlayer insulting film 13 caused by the thickness of the interconnection layer 6 under the second layer interlayer insulating film 13, as shown in FIG. 10. Thereafter, a third layer interlayer insulating film 15 is formed on the SOG silicon oxide film 14, and a through-hole contact 7 is formed to reach from the surface of the interlayer insulating film 15 to the lower level interconnection layer 6, for the purpose of connecting a second or upper level interconnection layer 4 to be formed after the formation of the SOG silicon oxide film, to the first or lower level interconnection layer 6 formed before the formation of the SOG silicon oxide film. In this through-hole contact 7, a contact face 18 generates between the upper level substrate interconnection filling the through-hole 7 and the SOG silicon oxide film 15.

After the wafer 19 is cut off along the scribing line area 8 into individual semiconductor chips and each of the individual semiconductor chips is mounted on a lead frame or the like and encapsulated by a molding resin into a product, when moisture enters from an ambient atmosphere at the outside of the semiconductor integrated circuit through a boundary between the molding resin and the lead frame, the moisture is absorbed from the scribing line area 8 to the SOG silicon oxide film 14, to enter the inside of the semiconductor chip 5. At this time, if the contact face 18 has generated, the moisture absorbed to the SOG silicon oxide film 14 reaches through the contact face 18 to the lower level interconnection layer 6 to corrode the lower level interconnection layer 6. Further, with elapse of the time, this corrosion reaches the upper level interconnection layer 4 through the through-hole contact 7. In a worst case, the contact 10 between the lower level interconnection layer 6 and the semiconductor substrate 9 becomes an insulating condition, with the result that the semiconductor integrated circuit becomes inoperable.

SUMMARY OF THE INVENTION

Accordingly, it is an object of the present invention to provide a semiconductor integrated circuit which has overcome the above mentioned defect of the conventional one.

Another object of the present invention is to provide a semiconductor integrated circuit capable of preventing corrosion of an interconnection layer caused by the moisture entering through a through-hole contact, thereby to avoid malfunction of the semiconductor integrated circuit.

The above and other objects of the present invention are achieved in accordance with the present invention by a semiconductor integrated circuit including at least two substrate interconnection layers separated from each other by an interlayer insulating film formed therebetween, an upper surface of the interlayer insulating film being coated with a silicon compound insulating film formed by coating an organic solution of a silicon compound, wherein the at least two substrate interconnection layers positioned in a predetermined scribing line area and excluding an uppermost substrate interconnection layer are divided into a plurality of segments separated from each other by gaps which are provided at a plurality of different locations and which allow the organic solution of the silicon compound to pass through the gaps when the organic solution of a silicon compound is applied.

In one embodiment of the semiconductor integrated circuit, the uppermost substrate interconnection layer is electrically connected to the plurality of segments of the at least two substrate interconnection layers excluding the uppermost substrate interconnection layer, through contacts hole formed to penetrate through the interlayer insulating film.

In a specific embodiment of the semiconductor integrated circuit, the semiconductor integrated circuit is formed on a rectangular semiconductor chip having a pair of opposing sides extending in parallel to an X coordinate axis of an X-Y coordinate and another pair of opposing sides extending in parallel to a Y coordinate axis of the X-Y coordinate, and the at least two substrate interconnection layers extend along four sides of the rectangular semiconductor chip. Furthermore, the at least two substrate interconnection layers excluding the uppermost substrate interconnection layer and extending in parallel to the X coordinate axis have the gaps located at the same X coordinate positions and the at least two substrate interconnection layers excluding the uppermost substrate interconnection layer and extending in parallel to the Y coordinate axis have the gaps located at the same Y coordinate positions.

The above and other objects, features and advantages of the present invention will be apparent from the following description of preferred embodiments of the invention with reference to the accompanying drawings.

DESCRIPTION OF THE PREFERRED EMBODIMENTS

Figure 9:
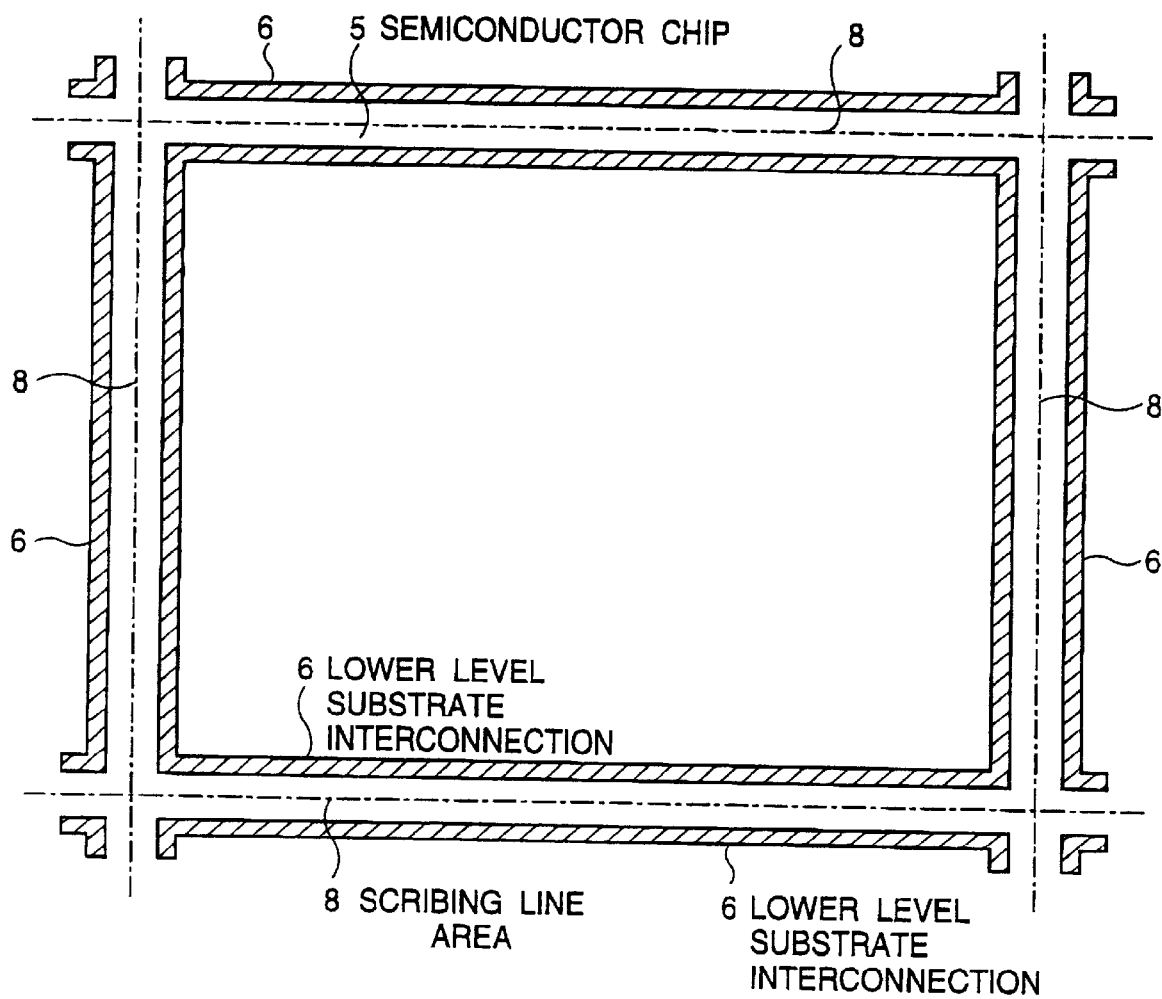
FIG. 9 is a diagrammatic enlarged plan view illustrating the location of a lower level substrate interconnection in a prior art semiconductor integrated circuit chip.
Figure 10:
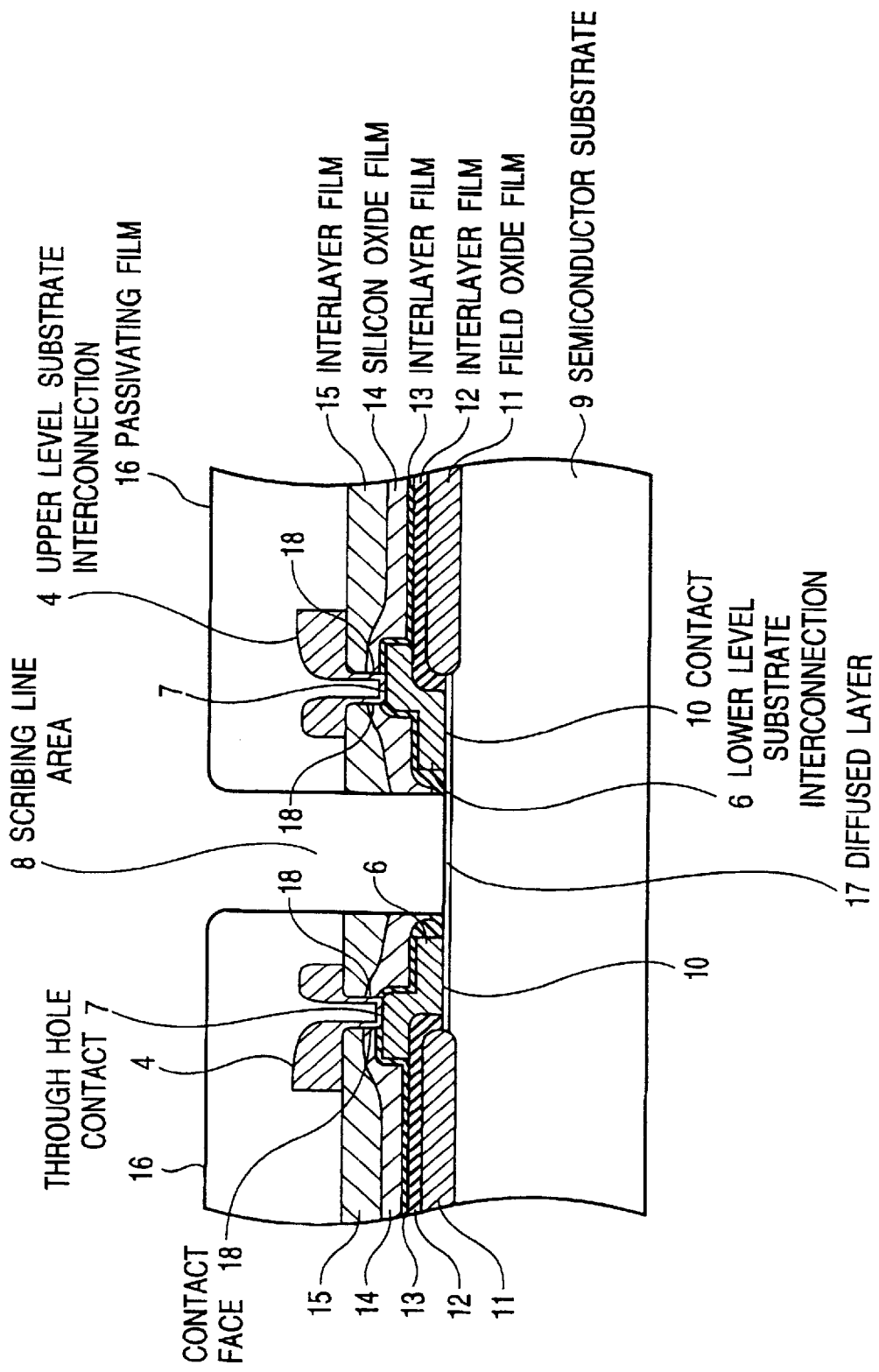
FIG. 10 is a diagrammatic partial sectional view of a substrate interconnection portion of the prior art semiconductor integrated circuit chip, where the SOG silicon oxide layer is deposited thickly.
Figure 11:
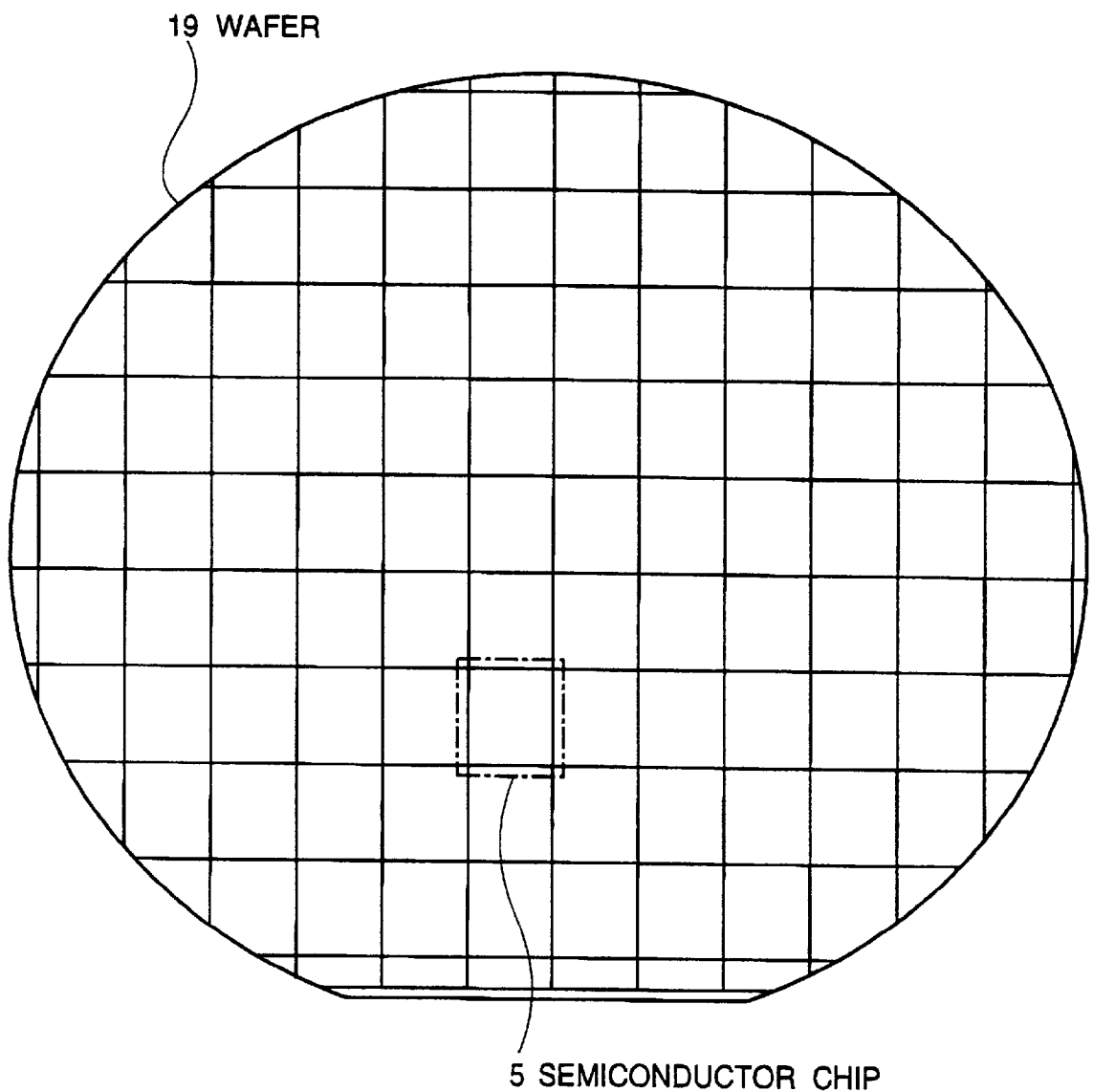
FIG. 11 illustrates many semiconductor chips formed in one semiconductor wafer.

Now, embodiments of the semiconductor integrated circuit chip in accordance with the present invention will be described with reference to the accompanying drawings. In the drawings, elements corresponding to those shown in FIGS. 9 to 11 are given the same Reference Numerals.

Figure 1:
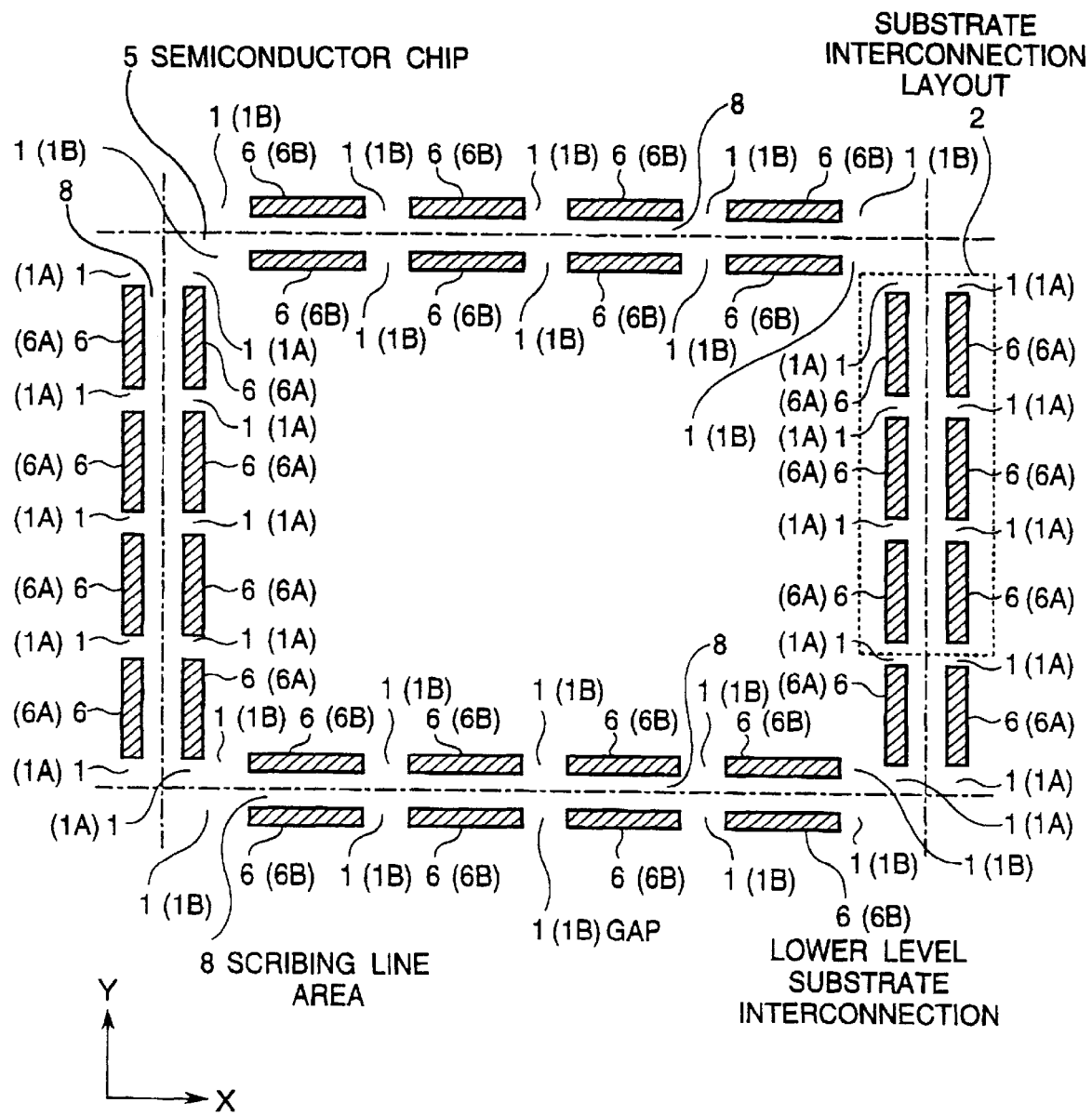
FIG. 1 is a diagrammatic enlarged plan view illustrating the location of a lower level substrate interconnection in a first embodiment of the semiconductor integrated circuit in accordance with the present invention.
Figure 2:
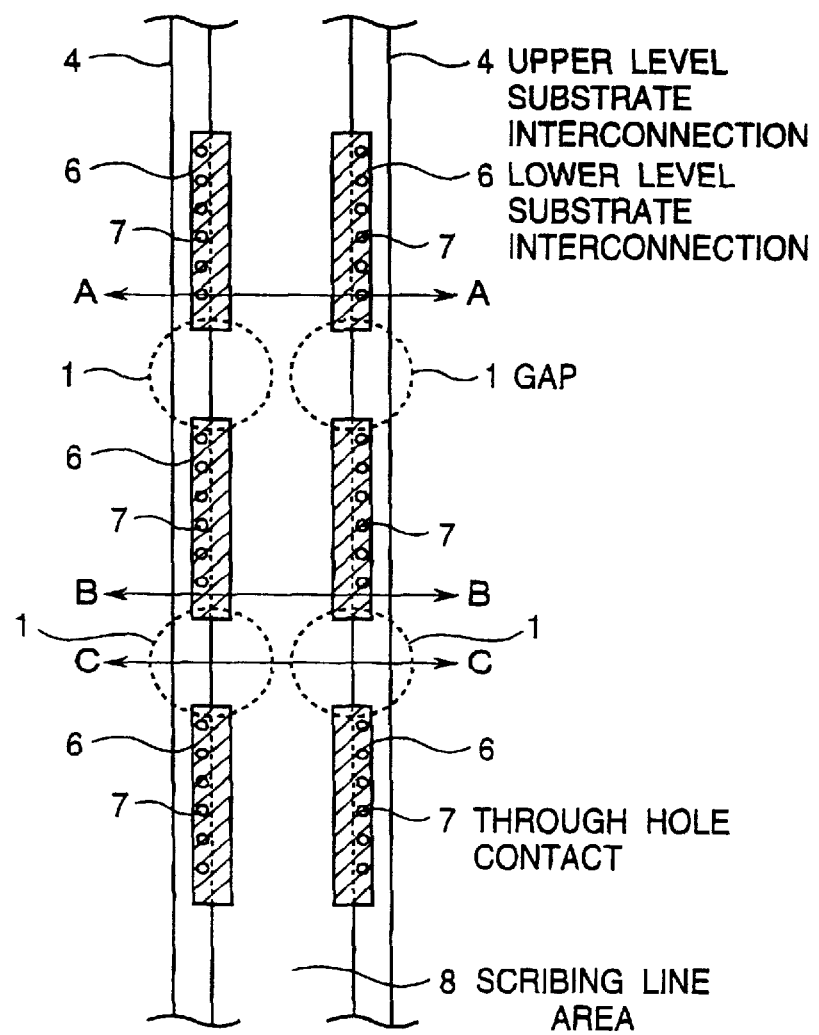
FIG. 2 is a further enlarged partial, diagrammatic plan view of the first embodiment of the semiconductor integrated circuit in accordance with the present invention, illustrating a relation between an upper level substrate interconnection and the lower level substrate interconnection.
Figure 3:
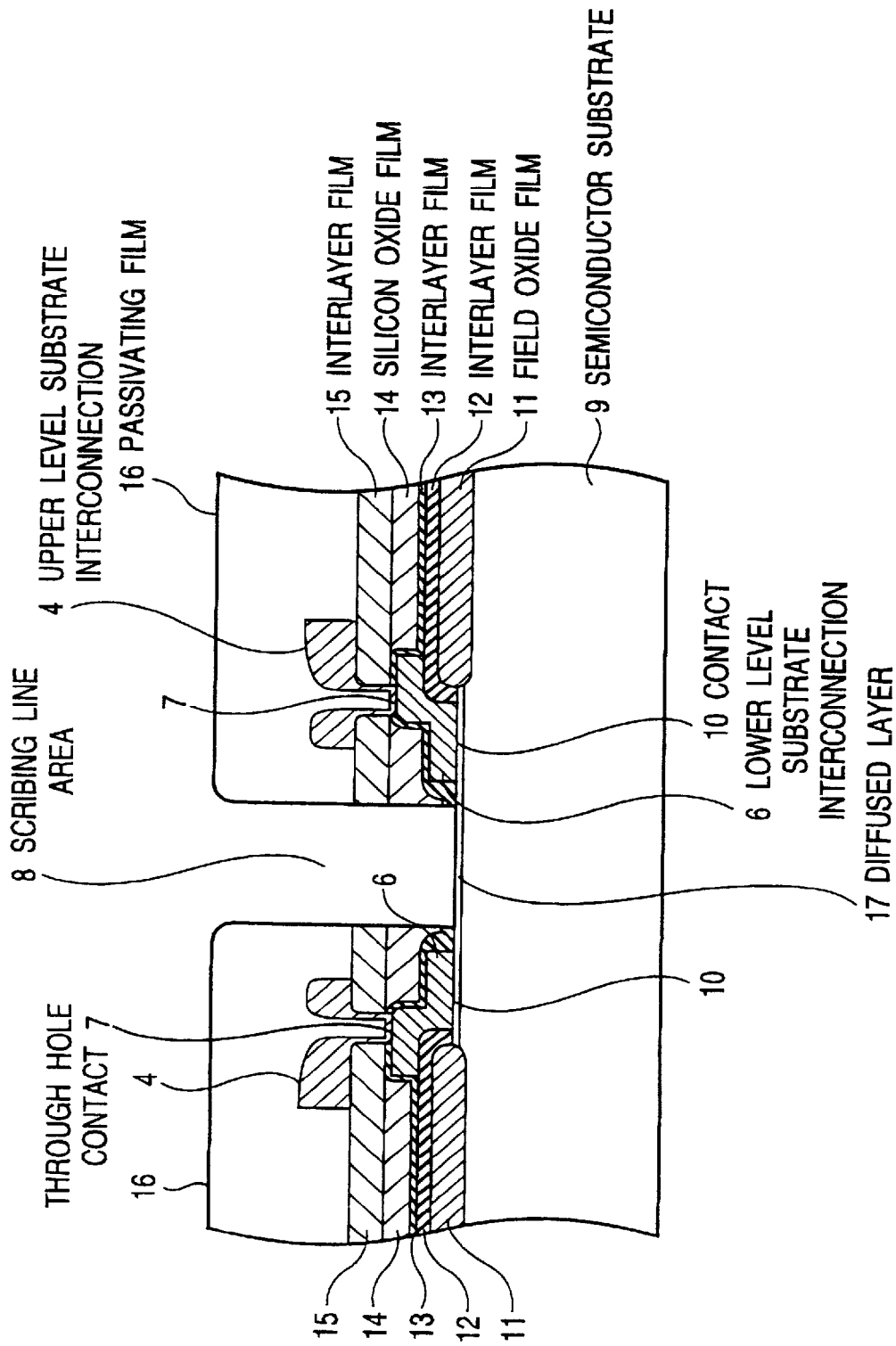
FIG. 3 is a diagrammatic sectional view taken along the line A—A in FIG. 2.
Figure 4:
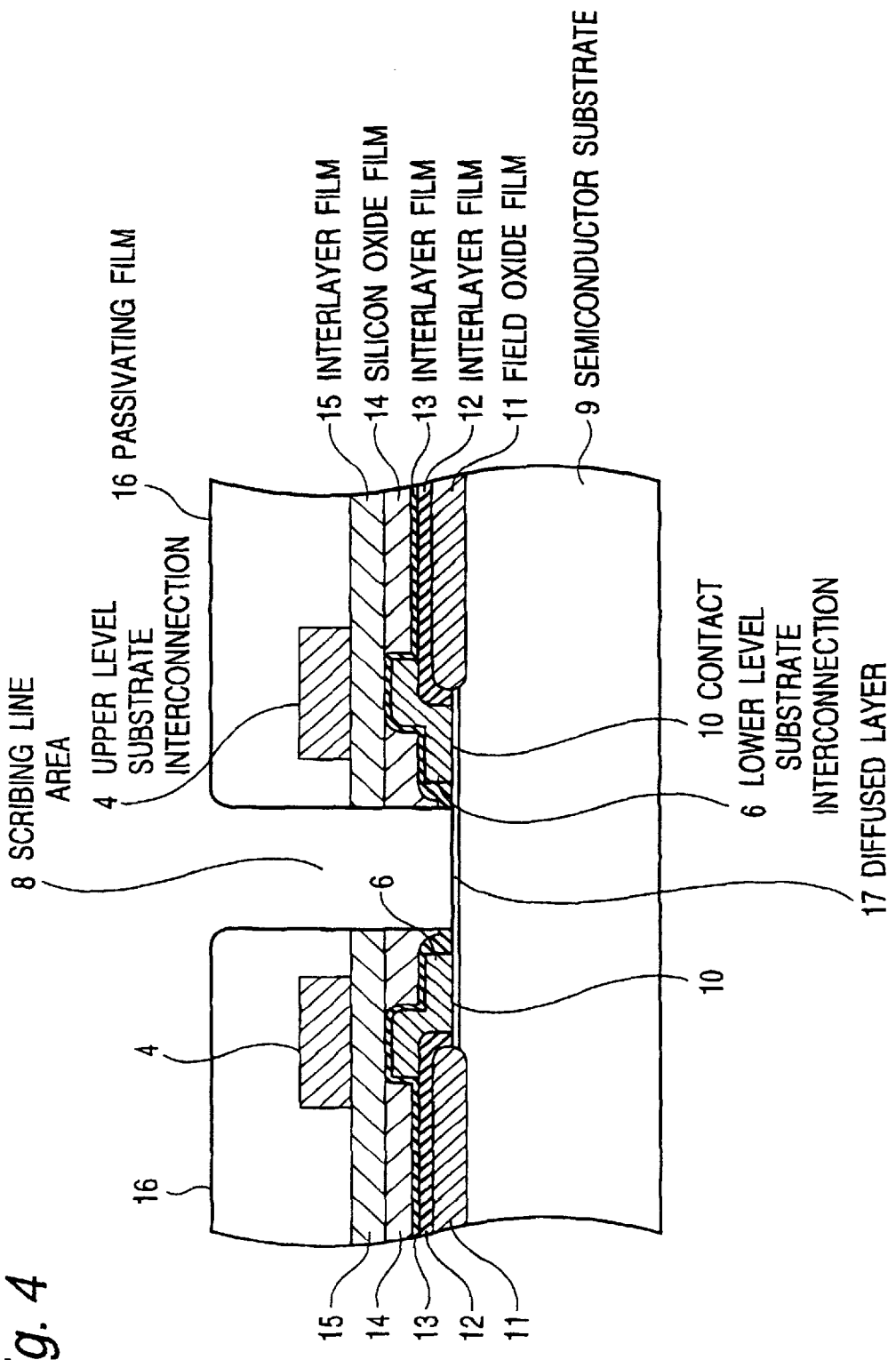
FIG. 4 is a diagrammatic sectional view taken along the line B—B in FIG. 2.
Figure 5:
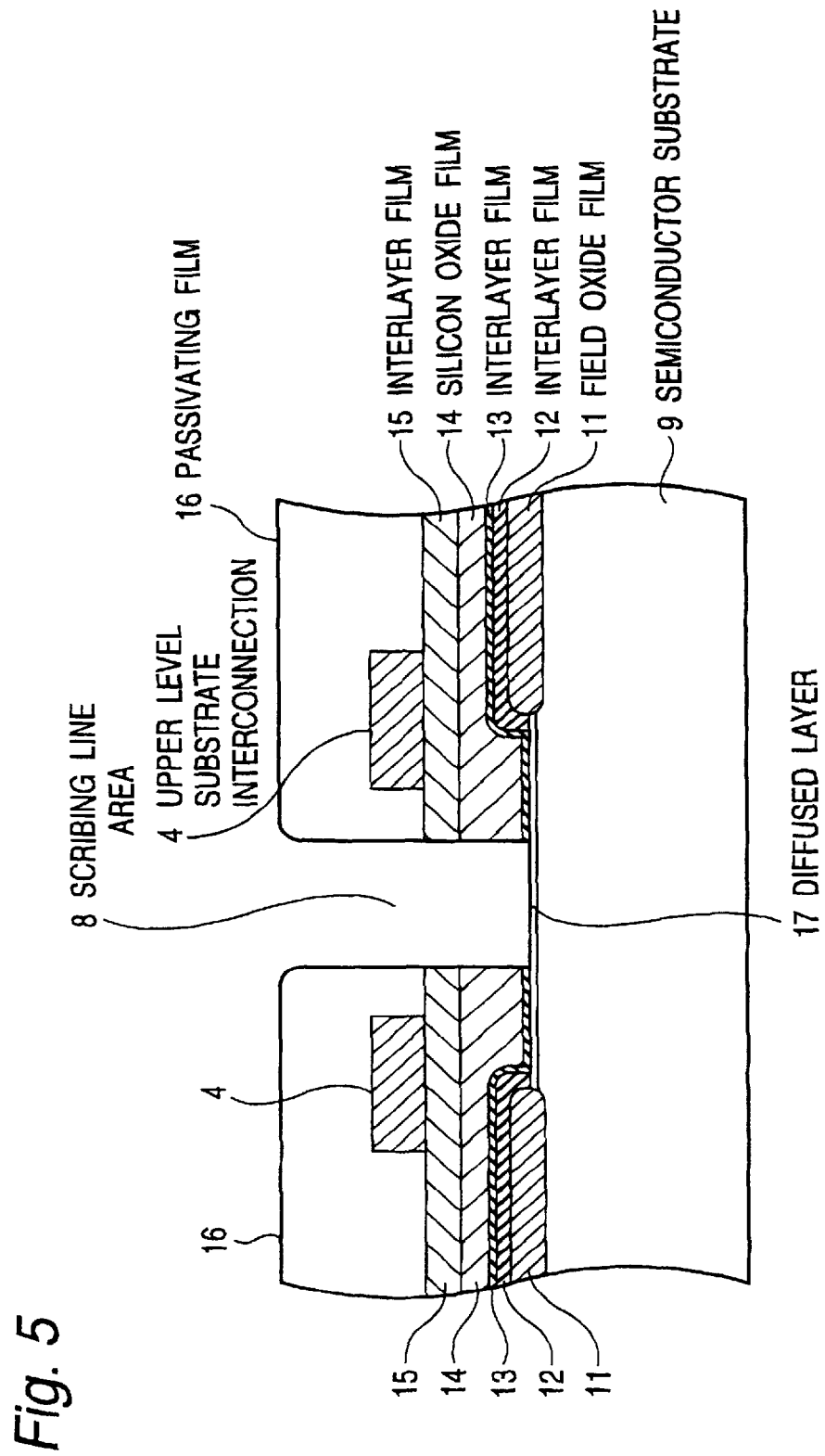
FIG. 5 is a diagrammatic sectional view taken along the line C—C in FIG. 2.

FIG. 1 is a diagrammatic enlarged plan view illustrating the location of a lower level substrate interconnection 6 in the semiconductor integrated circuit chip 5 in a first embodiment of the present invention, and FIG. 2 is a further enlarged partial, diagrammatic plan view of the first embodiment, illustrating a relation between an upper level substrate interconnection 4 and the lower level substrate interconnection 6, in the neighborhood of the scribing line area 8 between a pair of adjacent semiconductor chips formed in a semiconductor wafer, which is designated as a substrate interconnection layout 2 in FIG. 1. FIGS. 3, 4 and 5 are diagrammatic sectional views taken along the line A—A, the line B—B and the line C—C in FIG. 2, respectively.

In the semiconductor integrated circuit chip 5 as shown in FIGS. 1 and 2, a lower level substrate interconnection 6 formed at the level of a first level interconnection layer, is formed to depict a closed loop completely surrounding an inner region of the semiconductor chip 5, at an inside of a scribing line area 8 provided along a peripheral edge of the semiconductor chip 5, but is divided into a plurality of segments (6A and 6B) separated by a plurality of gaps 1 (1A and 1B) in order to cause an SOG solution to escape by passing therebetween. The gaps 1 are formed at positions to oppose to each other in a pair of lower level substrate interconnections 6 which oppose to each other but which are included in a pair of adjacent different semiconductor integrated circuit chips 5, respectively. In other words, assuming that the rectangular semiconductor chip 5 has a pair of opposing sides extending in parallel to an X coordinate axis of an X-Y coordinate and another pair of opposing sides extending in parallel to a Y coordinate axis of the X-Y coordinate, and the substrate interconnection layers extend along four sides of the rectangular semiconductor chip, a pair of opposing sides of the lower level substrate interconnection extending in parallel to the X coordinate axis are divided into a plurality of segments (6B) separated by the gaps (1B) located at the same X coordinate positions, and another pair of opposing sides of the lower level substrate interconnection extending in parallel to the Y coordinate axis are divided into a plurality of segments (6A) separated by the gaps (1A) located at the same Y coordinate positions. As shown in FIG. 1, the lower level substrate interconnection are cut out at four corners of the rectangular semiconductor chip 5 so that the gaps 1 are formed at the four corners of the rectangular semiconductor chip 5.

As shown in FIG. 2, the lower level substrate interconnections 6 divided into a plurality of segments by the gaps 1 are connected through through-hole contacts 7 to the upper level substrate interconnections 4 which can be formed to depict a closed loop completely surrounding the inner region of the semiconductor chip 5, at an inside of the scribing line area 8. The lower level substrate interconnection 6 is connected through a contact 10 to a semiconductor substrate 9 as shown in FIG. 3, and also connected to a pad (not shown) or a substrate potential generating circuit (not shown) in order to supply a necessary potential to the semiconductor substrate 9. However, if a plurality of pads are provided, or if a plurality of substrate potential generating circuits are provided, the lower level substrate interconnection 6 is not required to completely circulate around the inner region of the semiconductor chip 5, and therefore, can be cut off in the way.

Next, explanation will be made about the structure of the neighborhood of the gaps 1 in the lower level substrate interconnections 6 in order to cause the SOG solution to escape. The gaps 1 provided in the lower level substrate interconnection 6 for causing the SOG solution to escape, are formed at the time of patterning the lower level substrate interconnections 6. The size of the gaps 1 can be arbitrarily set, and can be changed dependently upon the location of the gaps. FIG. 3 illustrates a lateral and vertical positional relation between the upper level substrate interconnection 4, the lower level substrate interconnection 6, the through-hole contact 7, the scribing line area 8, the semiconductor substrate 9, the contact 10, a field oxide film 11, interlayer insulating films 12, 13 and 15, an SOG silicon oxide film 14, a passivation film 16, and a diffused layer 17.

In FIG. 3, the interlayer insulating film 12 is formed between the lower level substrate interconnection 6 and the field oxide film 11, and the lower level substrate interconnection 6 is formed on the interlayer insulating film 12 to partially ride on an outer edge portion of the field oxide film 11. At a position where the lower level substrate interconnection 6 is to be electrically connected to the semiconductor substrate 9, the interlayer insulating film 12 is partially removed by an etching in a contact formation process, so that the lower level substrate interconnection 6 is electrically connected through the contact 10 to the diffused layer 17 formed at a surface of the semiconductor substrate 9. The interlayer insulating film 13 is formed to cover the lower level substrate interconnection 6 and the interlayer insulating film 12, and the SOG silicon oxide film 14 is formed to fill recesses formed on the surface of the interlayer insulating film 13 to planarize the whole surface.

In this embodiment, the SOG silicon oxide film 14 does not remain on the interlayer insulating film 13 covering the portion of the lower level substrate interconnection 6 riding on the field oxide film 11. The interlayer insulating film 15 is formed to cover the SOG silicon oxide film 14 and the interlayer insulating film 13 covering the lower level substrate interconnection 6. The upper level substrate interconnection 4 is formed on the interlayer insulating film 15, and is connected to the lower level substrate interconnection 6 through the through-hole contact 7 which is formed to penetrate through only the interlayer insulating films 15 and 13 to reach the lower level substrate interconnection 6. Here, since the SOG silicon oxide film 14 does not remain on the interlayer insulating film 13 covering the portion of the lower level substrate interconnection 6 riding on the field oxide film 11, the upper level substrate interconnection 4 never contacts to the SOG silicon oxide film 14 in the through-hole contact 7.

Thus, a potential supplied to the upper level substrate interconnection 4 is supplied through the through-hole contact 7 to the lower level substrate interconnection 6 and further through the contact 10 to the semiconductor substrate 9. The passivation film 16 is a surface protection film for covering the semiconductor chip 5.

FIG. 4 is a sectional view taken along the line B—B passing through position where the through-hole contact 7 is not formed in FIG. 2. Similarly to FIG. 3, FIG. 4 illustrates a lateral and vertical positional relation between the upper level substrate interconnection 4, the lower level substrate interconnection 6, the scribing line area 8, the semiconductor substrate 9, the contact 10, the field oxide film 11, the interlayer insulating films 12, 13 and 15, the SOG silicon oxide film 14, the passivation film 16, and the diffused layer 17. Since FIG. 4 is similar to FIG. 3, excepting for the through-hole contact 7, a further explanation will be omitted for simplification of the description.

FIG. 5 is a sectional view taken along the line C—C passing through a position of the gap 6, namely, a position where the lower level substrate interconnection 6 is not formed in FIG. 2. Similarly to FIG. 3, FIG. 5 illustrates a lateral and vertical positional relation between the upper level substrate interconnection 4, the scribing line area 8, the semiconductor substrate 9, the field oxide film 11, the interlayer insulating films 12, 13 and 15, the SOG silicon oxide film 14, the passivation film 16, and the diffused layer 17. Since FIG. 5 is similar to FIG. 3, excepting that the through-hole contact 7, the lower level substrate interconnection 6, and the contact 10 are not formed, a further explanation will be omitted for simplification of the description. As seen from FIG. 5, at a position of the gap 1, no step is generated by the lower level substrate interconnection 6.

The semiconductor chip 5 shown in FIG. 1 is one picked up from many semiconductor chips formed in a semiconductor wafer 19 as shown in FIG. 11. At the time of applying an SOG solution required for planarization of the interlayer insulating film, after the interlayer insulating film 13 is formed to cover the lower level substrate interconnection 6 and the interlayer insulating film 12, the SOG solution is dropped from an upper nozzle onto the wafer 19 which is supported by a rotating rotary table and which therefore is rotating together with the rotary table, as well known to person skilled in the art. The SOG solution dropped on the wafer is spread to an outer edge of the wafer by action of a centrifugal force of the rotation. The rotational speed of the wafer and the amount of the SOG solution dropped on the wafer are previously determined to realize an optimum thickness of the SOG film.

As mentioned above, the SOG solution dropped on the wafer is uniformly distributed throughout the wafer by action of a centrifugal force of the rotation. For example, if the wafer 19 rotates clockwise in FIG. 11, the centrifugal force caused by the rotation of the wafer 19 acts on the chip 5 in a left direction in the drawing, so that the SOG solution also moves in the left direction in the drawing, to fill up recesses formed on the interlayer insulating film covering the lower level substrate interconnection 6. In this process, when the SOG solution reaches on the lower level substrate interconnection 6 formed on the periphery of the semiconductor chip 5, an excessive SOG solution is caused to escape from the semiconductor chip 5 through the gaps 1 between the divided segments of the lower level substrate interconnection. This advantage is further elevated if the lower level substrate interconnection are cut out at four corners of the rectangular semiconductor chip 5 so that the gaps 1 are formed at the four corners of the rectangular semiconductor chip 5, as shown in FIG. 1.

Furthermore, in the wafer 19, the gaps 1 formed in mutually adjacent lower level substrate interconnections of each pair of adjacent different semiconductor chips are located to be symmetrical with a center line of the scribing line area 8, namely, to align with each other at the same coordinate positions as mentioned hereinbefore. With this arrangement, the excessive SOG solution flows and moves from the gaps 1 of one semiconductor chip through the scribing line area 8 into the gaps of adjacent another semiconductor chip. As a result, the SOG solution can be uniformly coated throughout all the semiconductor chips in one wafer.

Figure 6:
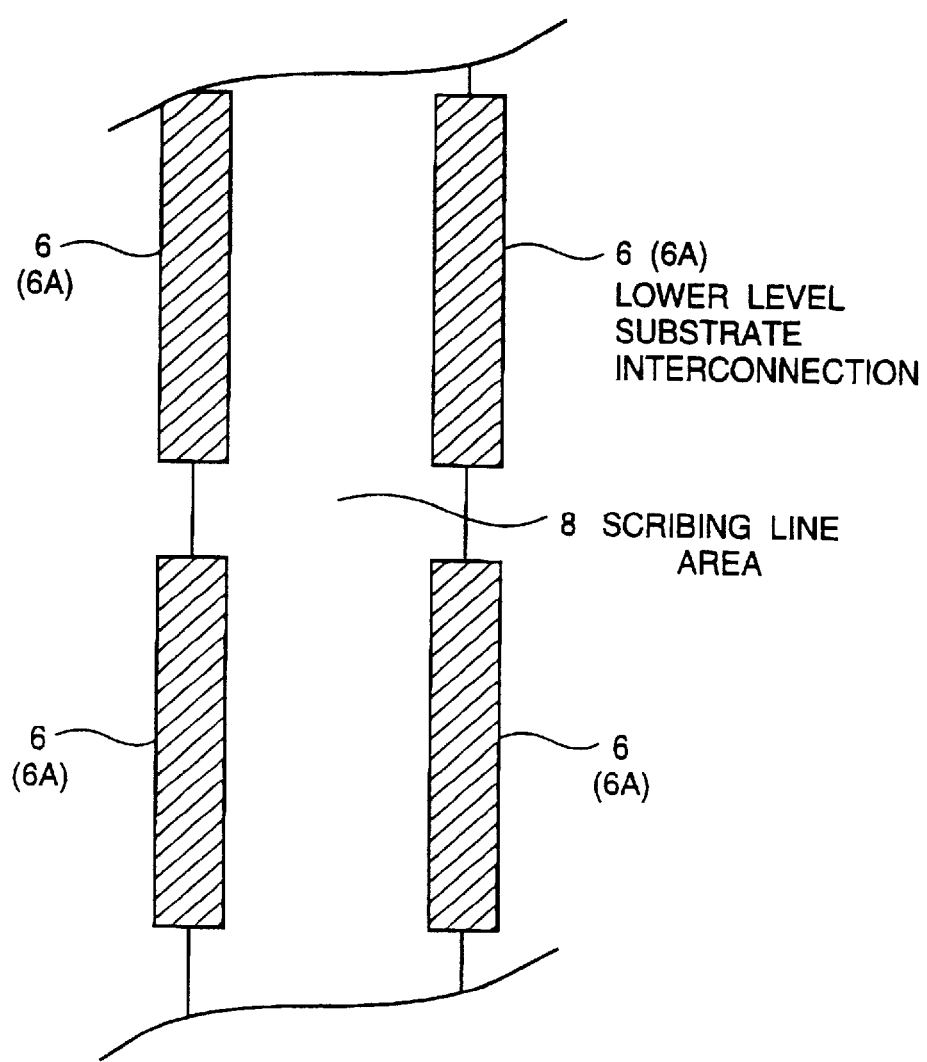
FIG. 6 illustrates a shape of the lower level substrate interconnection in the neighborhood of the scribing line area in the first embodiment.
Figure 7:
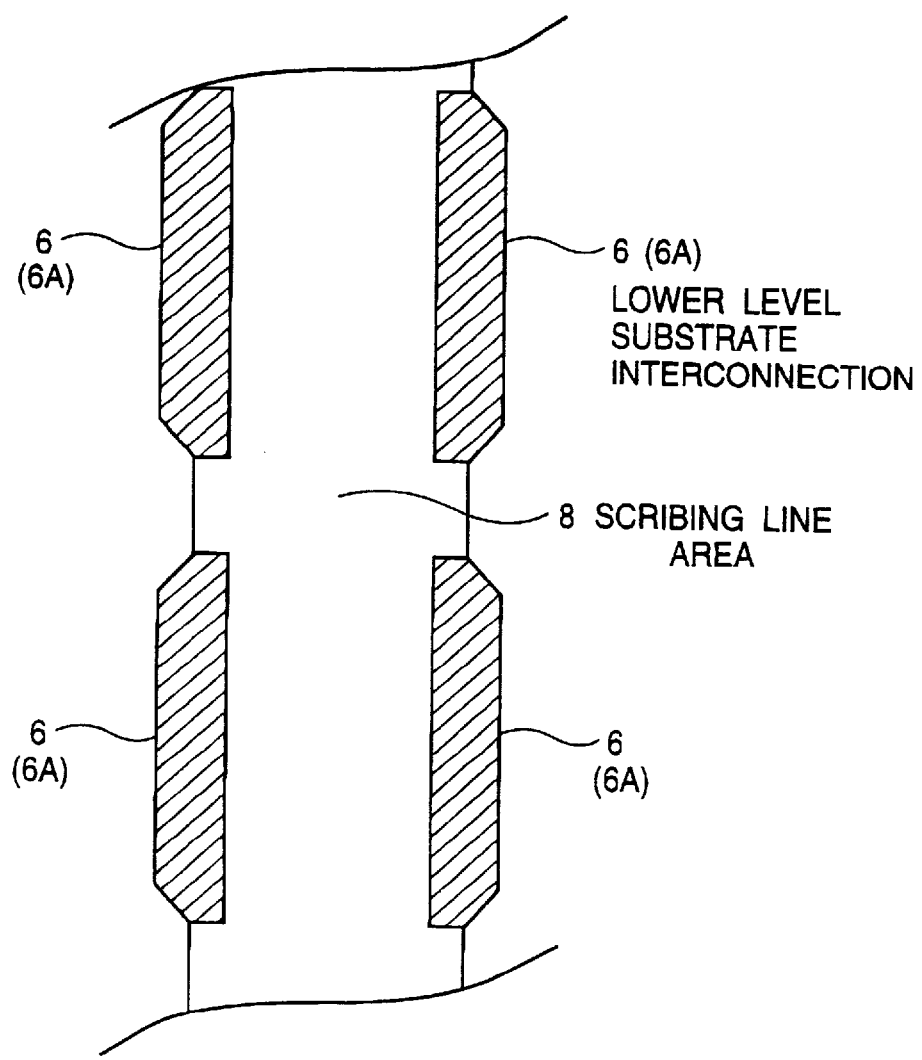
FIG. 7 illustrates another shape of the lower level substrate interconnection in he neighborhood of the scribing line area in the first embodiment.

Incidentally, the divided segments (6A and 6B) of the lower level substrate interconnections can be formed in any shape, which includes any polygon including a rectangle or a trapezoid, as shown in FIGS. 6 and 7, which are partial enlarged views of adjacent different lower level substrate interconnections separated by the scribing line area. In addition, the shape of the gaps 1 can take any shape in accordance with the shape of the divided segments (6A and 6B) of the lower level substrate interconnection 6.

As seen from the above, in this embodiment, since the excessive SOG solution can be taken out or removed through the gaps 1 formed in the lower level substrate interconnections 6, after the SOG silicon oxide film formed to cover the whole surface of the wafer is etched back to remove an unnecessary SOG silicon oxide film, the SOG silicon oxide film 14 no longer remains on the upheaved portion of the interlayer insulating film 13 covering the portion of the lower level substrate interconnection 6 riding on the field oxide film 11, as shown in FIGS. 3, 4 and 5. Therefore, the interlayer insulating film 15 is deposited directly on the upheaved portion of the interlayer insulating film 13 covering the portion of the lower level substrate interconnection 6 riding on the field oxide film 11, as shown in FIGS. 3, 4 and 5.

As a result, after the wafer 19 is cut off along the scribing line area 8 into individual semiconductor chips and each of the individual semiconductor chips is mounted on a lead frame and encapsulated by a molding resin into a product, when moisture enters from an ambient atmosphere through a boundary between the molding resin and the lead frame, even if the moisture is absorbed from the scribing line area 8 to the SOG silicon oxide film 14 to enter the inside of the semiconductor chip 5, the moisture does not reach the through-hole contact 7 for connecting between the upper level and lower level substrate interconnections 4 and 6, with the result that the lower level interconnection layer 6 is prevented from being corroded, and therefore, this corrosion never reaches the upper level interconnection layer 4 through the through hole contact 7 with elapse of the time. Thus, the malfunction of the semiconductor integrated circuit is avoided, so that the reliability can be elevated.

Figure 8:
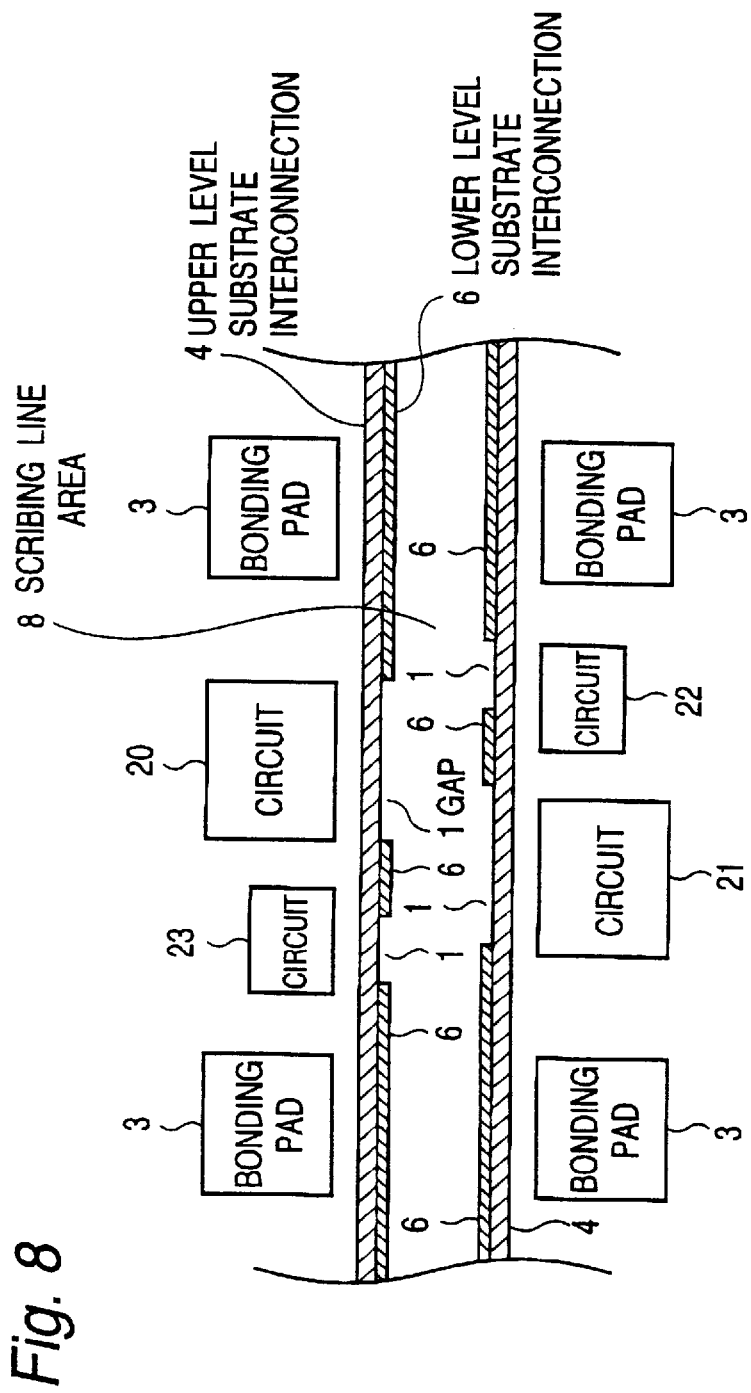
FIG. 8 is an enlarged partial, diagrammatic plan view illustrating the layout of a second embodiment of the semiconductor integrated circuit in accordance with the present invention.

Referring to FIG. 8, which is an enlarged partial, diagrammatic plan view illustrating the layout of the neighborhood of the scribing line area 8 between adjacent different semiconductor chips, a second embodiment of the semiconductor integrated circuit chip in accordance with the present invention will be described.

FIG. 8 illustrates a partial layout of substrate interconnections between a semiconductor chip including internal circuits 23 and 20 and bonding pads 3 and an adjacent semiconductor chip including internal circuits 21 and 22 and bonding pads 3. The gaps 1 formed in the respective lower level substrate interconnections 6 are located to correspond to the positions of the internal circuits 20 to 23 provided in the respective semiconductor chips. These internal circuits 20 to 23 include interconnection layers which connect to transistors and/or between transistors and which are located at the same level as that of the substrate interconnections. As a matter of course, since contacts for connecting between interconnections of different levels exist in these internal circuits, an excessive SOG solution remains in the internal circuits located in the lower level substrate interconnections 6 in the prior art, with the result that the lower level substrate interconnection 6 is corroded by the moisture entering through the contacts, so that malfunction of the semiconductor integrated circuit occurs.

In this embodiment, in order to avoid this malfunction, since the gaps 1 are provided in the lower level substrate interconnections, at the positions in the neighborhood of the internal circuits 20 to 23, the excessive SOG solution can be taken out or removed, so that a thick SOG silicon oxide film 14 is prevented from remaining in the inside of the internal circuits 20 to 23. Thus, the malfunction of the semiconductor integrated circuit is avoided, so that the reliability can be elevated.

In this second embodiment, since the internal circuits 20 to 23 can be located near to the lower level substrate interconnections 6, the size of the semiconductor chip can be reduced.

As seen from the above, in the semiconductor integrated circuit in accordance with the present invention, since a plurality of gaps are formed in the lower level substrate interconnection located at a periphery of the semiconductor chip to surround the internal region of the semiconductor chip, an excessive SOG solution can be removed from the neighborhood of the lower level substrate interconnection when the SOG solution is coated on the wafer. Therefore, it is possible to prevent the corrosion of the interconnection caused by the moisture which, in the prior art, entered through the through-hole contact and through the SOG silicon oxide film remaining on the step or upheaved portion formed by the lower level substrate interconnection.

Accordingly, the malfunction of the semiconductor integrated circuit is prevented, and the reliability of the semiconductor integrated circuit can be elevated In addition to the above mentioned advantage, if the internal circuits are located near to the gaps formed in the lower level substrate interconnection located at the periphery of the semiconductor chip to surround the internal region of the semiconductor chip, the internal circuits can be located near to the lower level substrate interconnection, with the result that the size of the semiconductor chip can be reduced.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit including at least two substrate interconnection layers separated from each other by an interlayer insulating film formed therebetween, an upper surface of said interlayer insulating film being coated with a silicon compound insulating film formed by coating an organic solution of a silicon compound, wherein said at least two substrate interconnection layers positioned in a predetermined scribing line area and excluding an uppermost substrate interconnection layer are divided into a plurality of segments separated from each other by gaps which are provided at a plurality of different locations and which allow said organic solution of said silicon compound to pass through said gaps when said organic solution of a silicon compound is applied.

2. A semiconductor integrated circuit claimed in claim 1 wherein said uppermost substrate interconnection layer is electrically connected to said plurality of segments of said at least two substrate interconnection layers excluding said uppermost substrate interconnection layer, through contacts hole formed to penetrate through said interlayer insulating film.

3. A semiconductor integrated circuit claimed in claim 2 wherein said semiconductor integrated circuit is formed on a rectangular semiconductor chip having a pair of opposing sides extending in parallel to an X coordinate axis of an X-Y coordinate and another pair of opposing sides extending in parallel to a Y coordinate axis of said X-Y coordinate, and said at least two substrate interconnection layers extend along four sides of said rectangular semiconductor chip, and wherein said at least two substrate interconnection layers excluding said uppermost substrate interconnection layer and extending in parallel to said X coordinate axis have said gaps located at the same X coordinate positions and said at least two substrate interconnection layers excluding said uppermost substrate interconnection layer and extending in parallel to said Y coordinate axis have said gaps located at the same Y coordinate positions.

4. A semiconductor integrated circuit claimed in claim 1 wherein said semiconductor integrated circuit is formed on a rectangular semiconductor chip having a pair of opposing sides extending in parallel to an X coordinate axis of an X-Y coordinate and another pair of opposing sides extending in parallel to a Y coordinate axis of said X-Y coordinate, and said at least two substrate interconnection layers extend along four sides of said rectangular semiconductor chip, and wherein said at least two substrate interconnection layers excluding said uppermost substrate interconnection layer and extending in parallel to said X coordinate axis have said gaps located at the same X coordinate positions and said at least two substrate interconnection layers excluding said uppermost substrate interconnection layer and extending in parallel to said Y coordinate axis have said gaps located at the same Y coordinate positions.

* * * * *